United States Patent [19]

Nguyen

[11] Patent Number: 5,132,609
[45] Date of Patent: Jul. 21, 1992

[54] CIRCUIT FOR MEASURING THE LEVEL OF AN ELECTRICAL SIGNAL AND INCLUDING OFFSET CORRECTION MEANS, AND APPLICATION THEREOF TO AMPLIFIERS HAVING AUTOMATIC GAIN CONTROL

[75] Inventor: Quang-Tan Nguyen, Orsay, France

[73] Assignee: Alcatel Cit, Paris, France

[21] Appl. No.: 629,904

[22] Filed: Dec. 19, 1990

[30] Foreign Application Priority Data

Dec. 22, 1989 [FR] France .................. 89 17107

[51] Int. Cl.$^5$ ............................................. G01R 1/02
[52] U.S. Cl. ............................. 324/130; 324/111; 307/4; 330/9
[58] Field of Search .............. 324/130, 142, 111; 307/491; 328/127; 341/140; 330/9

[56] References Cited

U.S. PATENT DOCUMENTS

| | | | |
|---|---|---|---|
| 4,109,308 | 8/1978 | Rodel | 330/9 |
| 4,137,504 | 1/1979 | Simmons | 328/127 |
| 4,363,977 | 12/1982 | Tsuda et al. | 330/9 |
| 4,665,326 | 5/1986 | Domogalla | 307/491 |
| 4,682,098 | 7/1987 | Seevinck et al. | 307/491 |
| 4,734,598 | 3/1988 | Bohme | 307/491 |
| 4,760,286 | 7/1988 | Pigott | 307/491 |
| 4,763,068 | 8/1988 | Schmitt et al. | 324/130 |
| 4,833,418 | 5/1989 | Quintus et al. | 330/9 |
| 4,839,535 | 6/1989 | Miller | 307/491 |
| 4,871,931 | 10/1989 | Fitzpatrick et al. | 307/491 |

FOREIGN PATENT DOCUMENTS

0332547 9/1989 European Pat. Off.

Primary Examiner—Kenneth A. Wieder
Assistant Examiner—William J. Burns
Attorney, Agent, or Firm—Sughrue, Mion, Zinn Macpeak & Seas

[57] ABSTRACT

A measurement circuit for measuring the level of an input electrical signal, the circuit comprising an input amplifier biased from a bias voltage, receiving the input signal, and producing an output signal, followed by a detector module itself followed by an integrator delivering an integration signal, these three components constituting a measurement channel, the integration signal being the sum of an offset signal and of a level signal which is proportional to the level of the input signal. The measurement circuit further includes a generator producing a reference voltage, a compensation module receiving the reference voltage and producing a compensation signal, and a differential measurement amplifier receiving the integration signal and the compensation signal and producing a measurement signal, wherein the bias voltage is constituted by the reference voltage, and wherein the compensation module comprises stages corresponding to the components of the measurement channel for conveying the reference voltage through conditions that match the conditions of the measurement channel, thereby producing, in particular, a correction signal having the same value as the offset signal, the correction signal being included in the compensation signal.

15 Claims, 2 Drawing Sheets

CIRCUIT FOR MEASURING THE LEVEL OF AN ELECTRICAL SIGNAL AND INCLUDING OFFSET CORRECTION MEANS, AND APPLICATION THEREOF TO AMPLIFIERS HAVING AUTOMATIC GAIN CONTROL

The invention relates to a circuit for measuring the level of an electrical signal, which measurement may optionally be performed relative to a reference voltage. It is advantageously applicable to amplifiers having automatic gain control (AGC).

Although the invention can be used with DC signals, its main application is with AC signals.

BACKGROUND OF THE INVENTION

The level of the signal is commonly measured by means of a measurement channel comprising an input amplifier followed by a detector module which is itself followed by an integrator. The amplifier (which includes bias means) produces an output signal comprising both an amplified version of the input signal and a DC component resulting from the bias and from various threshold voltages that stem from the conduction characteristics of the components used. The detector module which receives this signal at its input applies full- or half-wave rectification to the fraction of the signal which is proportional to the input signal, retains said DC component, and adds a voltage offset thereto due to its own bias means and threshold voltages. The integrator disposed at the output of the detector module thus produces an integration signal which is the sum of a voltage proportional to the level of the input signal and an offset voltage due to various bias voltages and threshold voltages.

In order to eliminate the offset voltage, a differential measurement amplifier is generally used receiving both the integration signal and a correction signal, and producing a measurement signal which is the difference between its two input signals. The correction signal must be equal to the offset voltage. It is commonly provided by means of a potentiometer connected to the power supply terminals of the circuit. This potentiometer is then adjusted for a given power supply voltage and a given temperature so that the correction signal is equal to the offset signal, e.g. when there is no input signal. If the power supply voltage and/or the temperature of the circuit vary, then the correction signal and the offset voltage vary in different manners and as a result their difference is no longer zero. The circuits of the measurement channel include semiconductor components which are non-linear and which have temperature coefficients that are very different from the temperature coefficient of a potentiometer. This gives rise to an error which is not acceptable in some applications.

An object of the present invention is thus to provide a circuit for measuring the level of a signal and in which the offset voltage and the correction signal have the same value regardless of operating conditions.

SUMMARY OF THE INVENTION

The present invention provides a measurement circuit for measuring the level of an input electrical signal, the circuit comprising an input amplifier biased from a bias voltage, receiving the input signal, and producing an output signal, followed by a detector module itself followed by an integrator delivering an integration signal, these three components constituting a measurement channel, the integration signal being the sum of an offset signal and of a level signal which is proportional to the level of the input signal. The measurement circuit further includes a generator producing a reference voltage, a compensation module receiving the reference voltage and producing a compensation signal, and a differential measurement amplifier receiving the integration signal and the compensation signal and producing a measurement signal, wherein the bias voltage is constituted by the reference voltage, and wherein the compensation module comprises stages corresponding to the components of the measurement channel for conveying the reference voltage through conditions that match the conditions of the measurement channel, thereby producing, in particular, a correction signal having the same value as the offset signal, the correction signal being included in the compensation signal.

In addition, in the circuit for measuring the level of an electrical signal, the compensation module produces a compensation signal comprising, in addition to the correction signal, an evaluation signal which is proportional to the reference voltage generating a comparison signal through the measurement amplifier, which comparison signal is also proportional to the reference voltage, the measurement signal being proportional to the difference between the comparison signal and the level of the input signal.

In one embodiment, the input signal is a differential signal, the input amplifier comprising identical first and second transistors each receiving a respective one of the input signal paths on its base, the collector of the first transistor being connected to a power supply voltage via a first resistor, the collector of the second transistor being connected to the power supply voltage via a second resistor having the same resistance as the first resistor, the emitters of the transistors being connected to the collector of a third transistor whose emitter is connected to ground via a third resistor and whose base receives the reference voltage via a first diode which matches the base-emitter junction of the third transistor, the diode being biased by a first diode resistor connected to the power supply voltage.

In addition, in the circuit for measuring an electrical signal, the detector module comprises a fourth transistor whose base is connected to the collector of the second transistor and whose collector is connected to the power supply voltage, and a fifth transistor whose base is connected to the collector of the first transistor and whose collector is connected to the power supply voltage, the emitters of the fourth and fifth transistors having a common point which is connected to ground via a common resistor.

Further, in the circuit for measuring the level of an electrical signal, the integrator is constituted by an R-C cell, the integration resistor of the cell connecting said common point to the first input of the measurement amplifier and the integration capacitor of the cell being connected firstly to the first input and secondly either to ground or to the output of the measurement amplifier.

In addition, in the circuit for measuring the level of an electrical signal, the compensation module comprises both a first stage corresponding to the input amplifier and constituted by a sixth transistor matching the third transistor with the emitter of the sixth transistor being connected to ground by a sixth resistor, with its collector connected to the power supply voltage via a seventh resistor, and with its base receiving the reference voltage via a second diode matching the first diode and the base-emitter junction of the sixth transistor, the second diode being biased by a second diode resistor connected to the power supply voltage, and a second stage corresponding to the detector module and constituted by a seventh transistor matching the fourth transistor and connected in common collector mode, with the base of the seventh transistor being connected to the collector of the sixth transistor, and with its emitter being connected firstly to ground via a resistor and secondly to the second input of the measurement amplifier via a compensation resistor.

Advantageously, in the circuit for measuring the level of an electrical signal, the first and second diodes are constituted by a single diode which matches the base-emitter junctions of both of the third and the sixth transistors, and the diode resistors are constituted by a single resistor.

In addition, in the circuit for measuring the level of an electrical signal, all of the components of the compensation module and of the measurement channel other than the integration capacitor are integrated in a monolithic circuit.

Further, in the circuit for measuring the level of an electrical signal, the integration capacitor may also be integrated in the monolithic circuit.

Advantageously, in the circuit for measuring the level of an electrical signal, the generator is a module whose output voltage is referenced to the band gap of a semiconductor.

Thus, in the circuit for measuring the level of an electrical signal, the generator is also integrated in the monolithic circuit.

Similarly, in the circuit for measuring the level of an electrical signal, the measurement amplifier is also integrated in the monolithic circuit.

The circuit of the invention for measuring the level of an electrical signal is applicable in an automatic gain control (AGC) circuit comprising an AGC amplifier producing the input signal from an reception signal and receiving the measurement signal as its control signal.

In addition, in this application of the circuit for measuring the level of an electrical signal, the input amplifier is the output stage of the AGC amplifier.

The circuit of the invention for measuring the level of an electrical signal can also be applied to demodulating an amplitude modulated signal, with the correction signal constituting the compensation signal.

BRIEF DESCRIPTION OF THE DRAWINGS

An embodiment of the invention is described by way of example with reference to the accompanying drawings, in which.

DETAILED DESCRIPTION

Figure 1:
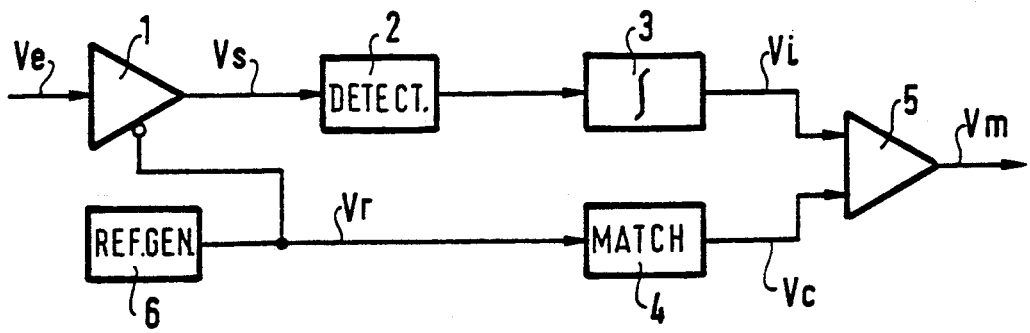
FIG. 1 is a block diagram of a measurement circuit of the invention for measuring the level of an electrical signal.

The measurement circuit for measuring the level of a signal shown in block diagram form in FIG. 1 comprises a measurement channel constituted by an amplifier 1 receiving an input signal Ve and producing an output signal Vs, a detector module 2 receiving said outout signal, and following the module, an integrator 3 which delivers an integration signal Vi. The output signal Vs is constituted in part by an AC signal proportional to the input signal Ve and in part by a DC component due to the various bias and threshold voltages of semiconductor components such as diodes or transistors that are present in the input amplifier. The detector module produces a composite signal comprising both a rectified signal corresponding to the AC signal produced by an input amplifier and an offset voltage derived from the various threshold voltages and bias voltages of the input amplifier and of the detector module. The integrator 3, so called because of its averaging function, is a lowpass filter and thus provides an integration signal which is the sum of said offset voltage and a level signal which is proportional to the level of the input signal.

The measurement circuit also includes a compensation module 4 which receives a reference voltage Vr and which produces a compensation signal Vc.

The measurement circuit also includes a differential measurement amplifier 5 which receives both the integration signal and the compensation signal, and which produces a measurement signal Vm proportional to the difference between the two signals it receives.

Finally, the measurement circuit includes a generator 6 which produces the reference voltage Vr and which delivers it simultaneously to the input amplifier 1 and the compensation module. This reference voltage is used for establishing operating conditions, in particular bias voltage values, in the various parts of the measurement channel and of the compensation module.

The compensation module 4 includes stages that match the various stages of the measurement channel. By "matching" it should be understood that they operate under the same conditions and that if two transistors or two diodes "match" then when they are at the same temperature and when they are passing the same current density, they present the same threshold voltages and the same amplification coefficients. The compensation module is thus capable of delivering a signal which exactly compensates the offset voltage of the measurement channel.

Figure 2:
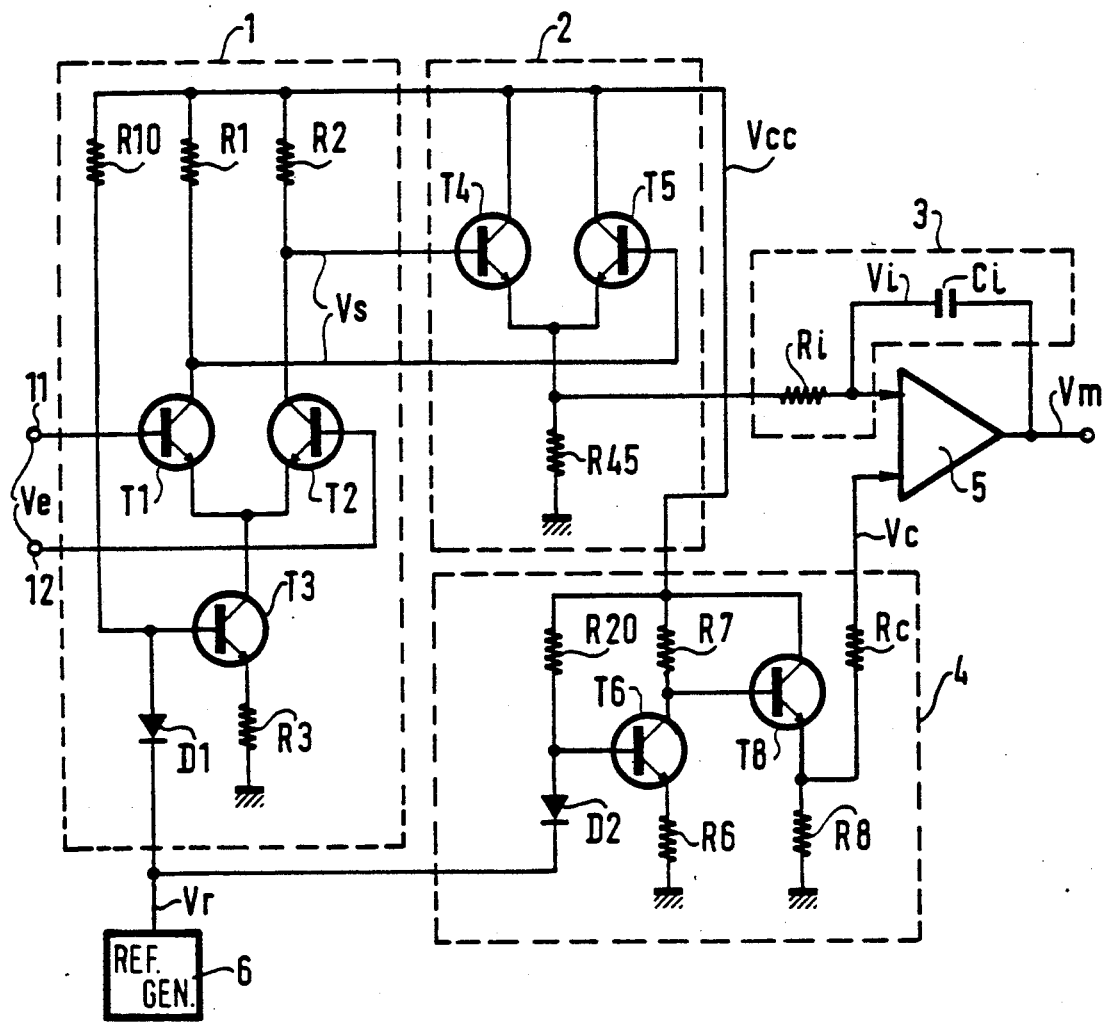
FIG. 2 is a circuit diagram of a particular embodiment of the measurement circuit.

An embodiment is now described in detail with reference to FIG. 2 which is a circuit diagram of the measurement circuit. This example is given to clarify the various relationships which link together the compensation module and the measurement channel. The invention is not limited to this particular circuit.

The measurement circuit is powered by a power supply delivering a positive DC voltage Vcc referenced to ground.

The generator 6 which produces the reference voltage is constituted, for example, by a zener diode having a low temperature coefficient, or by a circuit whose output voltage is referenced to the band gap of a semiconductor such as silicon. A circuit of this type is described, in particular, at pages 289 to 296 of the book "Analysis and design of analog integrated circuits" by Paul Gray and Robert Meyer, and published by John Wiley and Sons in 1984. The output voltage Vr may be considered as being constant.

In this case, the input amplifier 1 is a differential amplifier having a voltage gain K1 and two input terminals 11 and 12. The input signal Ve is the potential difference between these two terminals. This amplifier thus comprises a pair of transistors T1 and T2 whose bases are connected respectively to the terminals 11 and 12 and whose collectors are connected to the power supply Vcc via respective same-resistance resistors R1 and R2. The emitters of the transistor T1 and T2 are connected to the collector of a transistor T3 which operates in constant current mode since its base is connected firstly to the power supply Vcc via a resistor R10 and secondly to the generator 6 via a diode D1. The emitter of transistor T3 is connected to ground by a resistor R3. The diode D1 is chosen to match the base-emitter junction of transistor T3, such that these two components present an equivalent potential difference at their terminals regardless of operating conditions. The emitter voltage of transistor T3 which constitutes a bias voltage is thus equal to the reference voltage Vr.

The emitter current through T3 is Vr/R3.

The collector current through T3 is given by $(Vr/R3) \cdot (\beta 3/(\beta 3+1))$ where $\beta 3$ is the current amplification coefficient of T3.

The collector voltages of transistors T1 and T2 are equal since the resistances R1 and R2 are equal and the transistors are identical. The collector current of each of these transistors in the absence of an input signal Ve is equal to one-half of the collector current transistor T3, neglecting the base currents of these transistors. Their collector voltages are thus equal to:

$$Vcc - (R1/2) \cdot (Vr/R3) \cdot (\beta 3/(\beta 3+1))$$

When there is a non-zero input signal Ve, then the collector of one of the transistors T1 and T2 is at a voltage:

$$Vcc - (R1/2R3) \cdot (\beta 3/(\beta 3+1)) \cdot Vr - K1 \cdot Ve$$

while the other is at a voltage:

$$Vcc - (R1/2R3) \cdot (\beta 3/(\beta 3+1)) \cdot Vr + K1 \cdot Ve.$$

The detector module 2 has two identical transistors T4 and T5 whose collectors are connected to Vcc and whose emitters are connected to a common point which is connected to ground via a resistor R45. The base of transistor T4 is connected to the collector of transistor T2 and the base of transistor T5 is connected to the collector of transistor T1. In the absence of any input signal, the common point is thus at the collector voltage of transistors T1 and T2 minus the base-emitter voltage Vbe4 of transistors T4 and T5 which are identical. I.e. at a voltage equal to:

$$Vcc - (R1/2R3) \cdot (\beta 3/(\beta 3+1)) \cdot Vr - Vbe4$$

if $|Ve|$ represents the absolute value of Ve, then the voltage at the common point is:

$$Vcc - (R1/2R3) \cdot (\beta 3/(\beta 3+1)) \cdot Vr - Vbe4 + K1 \cdot |Ve|$$

at any instant since the circuit constitutes a full-wave rectifier.

The integrator 3 is a conventional RC type cell. It thus comprises a resistor Ri connected to the common point between the emitters of transistors T4 and T5 and to the negative input of differential amplifier 5. The capacitor Ci of this cell is also connected to the negative input of the amplifier 5 and its other terminal is connected to the output of the same amplifier. Although the capacitor could be connected to ground, connecting it in this manner is equivalent to multiplying its capacitance by the gain of the amplifier. If $I_-$ is the input current to the amplifier 5 on its negative input and if Ve* is the level of the input signal, then the integration signal Vi applied to said input is given by:

$$Vi = Vcc - (R1/2R3) \cdot (\beta 3/(\beta 3+1)) \cdot Vr - Vbe4 + K1 \cdot Ve^* - Ri \cdot I_-$$

Vi may be written in a different form by introducing the offset voltage Vd:

$$Vd = Vcc - (R1/2R3) \cdot (\beta 3/(\beta 3+1)) \cdot Vr - Vbe4 - Ri \cdot I_-$$

$$Vi = K1 \cdot Ve^* + Vd$$

The compensation module 4 comprises two stages designed to compensate the offsets due respectively to the input amplifier 1 and to the detector module 2. The first stage comprises a transistor T6 which delivers a constant current like the transistor T3 since its base is connected firstly to the power supply Vcc via a resistor R20 and secondly to the generator 6 via a diode D2. The emitter of transistor T6 is connected to ground by a resistor R6 and its collector is connected to Vcc via a resistor R7. Since the diode D2 matches the base emitter junction of transistor T6, these two components present an identical potential difference between their terminals regardless of operating conditions. The emitter voltage of transistor T6 is thus equal to the reference voltage Vr.

The emitter current of T6 is Vr/R6.

The collector voltage of T6 is therefore:

$$Vcc - (R7/R6) \cdot (\beta 6/(\beta 6+1)) \cdot Vr$$

where $\beta 6$ is the current amplification coefficient of transistor T6.

The second stage which corresponds to the detector module 2 comprises a transistor T8 connected in common collector mode with its emitter connected to ground via a resistor R8 and to the positive input of measurement amplifier 5 via a resistor Rc. The base of transistor T8 is connected to the collector of transistor T6, and the emitter voltage of transistor T8 is thus given by:

$$Vcc - (R7 \cdot R6) \cdot (\beta 6/(\beta 6+1)) \cdot Vr - Vbe8$$

where Vbe8 is the base-emitter voltage of the transistor T8. If $I_+$ is the input current to the positive input of amplifier 5, then the compensation signal Vc applied to said input is:

$$Vc = Vcc - (R7/R6) \cdot (\beta 6/(\beta 6+1)) \cdot Vr - Vbe8 - Rc \cdot I_+$$

Since the measurement amplifier 5 has gain G, it produces a measurement signal $Vm = G \cdot (Vc - Vi)$ $$Vm = G \cdot [Vcc - (R7/R6) \cdot (\beta 6/(\beta 6 + 1)) \cdot Vr - Vbe8 - Rc \cdot I_+ -$$
$$(Vcc - (R1/2R3) \cdot (\beta 3/(\beta 3 + 1)) \cdot Vr - Vbe4 + K1 \cdot Ve^* - Ri \cdot I_-]$$
$$= G \cdot [[(R1/2R3) \cdot (\beta 3/(\beta 3 + 1)) - (R7/R6) \cdot (\beta 6/(\beta 6 + 1))] \cdot Vr -$$
$$K1 \cdot Ve^* + Vbe4 - Vbe8 + Ri \cdot I_- - Rc \cdot I_+]$$

Since $\beta 3$ and $\beta 6$ are much greater than unity, the fractions $\beta 3/(\beta 3+1)$ and $\beta 6/(\beta 6+1)$ are substantially equal to unity. Further, since the transistor T8 matches transistors T4 and T5, Vbe8 is equal to Vbe4. Finally, since the input currents $I_+$ and $I_-$ to the measurement amplifier are equal, and since resistors Rc and Ri are chosen to have the same resistances, the term $Ri \cdot I_- - Rc \cdot I_+$ is zero. The measurement signal Vm is thus given by:

$$Vm = G \cdot [(R1/2R3 - R7/R6) \cdot Vr - K1 \cdot Ve^*]$$

The measurement signal Vm thus depends only on the reference voltage Vr and on the level of the input signal Ve*. Writing:ps
$$K2 = R1/2R3 - R7/R6$$

then:

$$Vm = G \cdot (K2 \cdot VR - K1 \cdot Ve^*)$$

In a first utilization, the measurement signal Vm is proportional to the level of the input signal Ve*. The resistances of resistors R1, R3, R6, and R7 are chosen so that the coefficient K2 cancles. The compenstion signal is then reduced to a correction signal Va which has the same value as the offset voltage Vd:

$$Va = Vcc - (R1/2R3) \cdot Vr - Vbe4 - Ri \cdot I_-$$

In this utilization, by setting an appropriate time constant for the integrator 3, the measurement circuit is advantageous for measuring or demodulating an amplitude modulated signal.

In a second utilization, the measurement signal Vm is proportional to the difference between a comparison signal V* and the level of the input signal Ve*, said comparison signal V* being itself proportional to the reference voltage Vr:

$$V^* = (K2/K1) \cdot Vr$$

$$Vm = G \cdot K1 \cdot (V^* - Ve^*)$$

The compensation signal can then be considered as being the sum of the above-defined correction signal Va and of an evaluation signal Vb:

$$Vb = Vr \cdot (R1/2R3 - R7/R6)$$

$$Vc = VA + Vb$$

Figure 3:
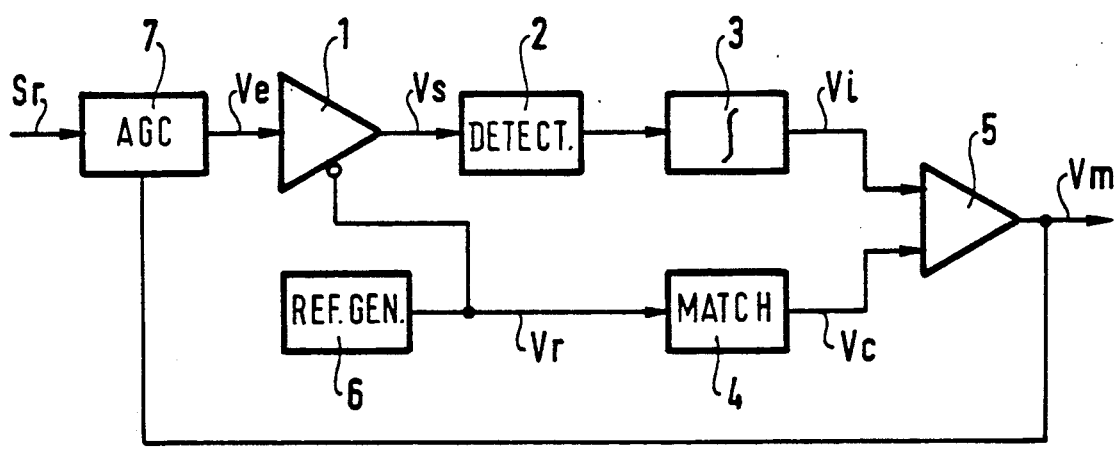
FIG. 3 is a block diagram of an applicaiton of the measurement circuit to automatic gain control circuits.

In this utilization, the measurement circuit is advantageously applied to AGC amplifiers. In an application of this type whose block diagram is given in FIG. 3, an AGC amplifier 7 of known type amplifies a reception signal Sr to produce the input signal Ve for the input amplifier 1, and it receives the measurement signal Vm from the measurement amplifier 5 as its control signal. The circuit acts on the gain of the amplifier in such a manner as to cause Ve* to tend towards V*.

Without going beyond the scope of the invention, the module conventionally referred to as the input amplifier 1 may be constituted by the output stage of the AGC amplifier 7. The AC component of the output signal Vs is servo-controlled in the same manner on the comparison signal V* since it is equal to K1·Ve.

Components R10 and D1 and components R20 and D2 have equivalent functions. They are shown diagrammatically in this manner to simplify the description of the measurement circuit. In a practical embodiment, they would be replaced by a single diode D and a single resistor Rd connected between the power supply voltage Vcc and the diode, with the other electrode of the diode receiving the reference voltage Vr from the generator 6. The bases of transistors T3 and T6 would then be connected to the common point between the diode D and the resistor Rd, with the diode D and the transistors T3 and T6 all matching one another.

All of the components constituting the measurement circuit, except for the possible exception of the capacitor Ci in the integrator 3, may be integrated in a single monolithic circuit. In this case, the components will be at the same temperature or at temperatures that are very close, relative variation between resistors will be very low, and the non-linear components such as diodes and transistors will match almost perfectly, since the relative variations in their geometrical dimensions will also be very small.

Whether or not the capacitor Ci can be integrated depends on its capacitance and on technological constraints.

It is mentioned that the transistor T6 matches the transistor T3. The scale factor of the match may have any value including unity, but if the emitter current of transistor T3 is large it may be advantageous to choose a scale factor of 10, for example, thereby reducing the area of the measurement circuit and also its consumption of electrical energy. R6 would then need to have a resistance that is ten times greater than R3 and the area of the emitter of transistor T6 would be ten times smaller than that of transistor T3.

In the above description, the measurement circuit is powered between a positive voltage Vcc and ground. The invention is easily generalized to a differennt type of power supply, and in particular to a symmetrical power supply.

Similarly, the invention should not be considered as being limited to its inpuut amplifier 1 being constituted by a differential amplifier as in the particular embodiment described.

I claim:

1. A measurement circuit for measuring the level of an input electrical signal, the circuit comprising an input amplifier biased from a bias voltage, receiving said input signal, and producing an output signal, followed by a detector module itself followed by an integrator delivering an integration signal, these three components constituting a measurement channel, said integration signal being the sum of an offset signal and of a level signal which is proportional to the level of said input signal, said measurement circuit further including a generator producing a reference voltage, a compensation module receiving said reference voltage and producing a compensation signal, and a differential measurement amplifier receiving said integration signal and said compensation signal and producing a measurement signal, wherein said bias voltage is constituted by said reference voltage, and wherein said compensation module comprises stages corresponding to said components of said measurement channel for conveying said reference voltage through conditions that match the conditions of said measurement channel, thereby producing, in particular, a correction signal having the same value as said offset signal, said correction signal being included in said compensation signal.

2. A measurement circuit according to claim 1, wherein said compensation module produces a compensation signal comprising, in addition to said correction signal, an evaluation signal which is proportional to said reference voltage generating a comparison signal through said measurement amplifier, which comparison signal is also proportional to said reference voltage, said measurement signal being proportional to the difference between said comparison signal and the level of said input signal.

3. A measurement circuit according to claim 1, wherein said input signal is a differential signal, said input amplifier comprising identical first and second transistors each receiving a respective one of the input signal paths on its base, the collector of the first transistor being connected to a power supply voltage via a first resistor, the collector of the second transistor being connected to said power supply voltage via a second resistor having the same resistance as said first resistor, the emitters of said transistors being connected to the collector of a third transistor whose emitter is connected to ground via a third resistor and whose base receives said reference voltage via a first diode which matches the base-emitter junction of said third transistor, said diode being biased by a first diode resistor connected to said power supply voltage.

4. A measurement circuit according to claim 3, wherein said detector module comprises a fourth transistor whose base is connected to the collector of said second transistor and whose collector is connected to said power supply voltage, and a fifth transistor whose base is connected to the collector of said first transistor and whose collector is connected to said power supply voltage, the emitters of said fourth and fifth transistors having a common point which is connected to ground via a common resistor.

5. A measurement circuit according to claim 4, wherein said integrator is constituted by an R-C cell, the integration resistor of said cell connecting said common point to the first input of said measurement amplifier and the integration capacitor of said cell being connected firstly to said first input and secondly either to ground or to the output of said measurement amplifier.

6. A measurement circuit according to claim 4, wherein said compensation module comprises both a first stage corresponding to said input amplifier and constituted by a sixth transistor matching said third transistor with the emitter of the sixth transistor being connected to ground by a sixth resistor, with its collector connected to said power supply voltage via a seventh resistor, and with its base receiving said receiving voltage via a second diode matching said first diode and the base-emitter junction of said sixth transistor, said second diode being biased by a second diode resistor connected to said power supply voltage, and a second stage corresponding to said detector module and constituted by a seventh transistor matching said fourth transistor and connected in common collector mode, with the base of the seventh transistor being connected to the collector of said sixth transistor, and with its emitter being connected firstly to ground via a resistor and secondly to the second input of the measurement amplifier via a compensation resistor.

7. A measurement circuit according to claim 6, wherein said first and second diodes are constituted by a single diode which matches the base-emitter junctions of both of said third and the sixth transistors, and said diode resistors are constituted by a single resistor.

8. A measurement circuit according to claim 1, wherein all of the components of said measurement channel and of said compensation module are integrated in a monolithic circuit.

9. A measurement circuit according to claim 5, wherein all of the components of said compensation module and of said measurement channel other than said integration capacitor are integrated in a monolithic circuit.

10. A measurement circuit according to claim 8, wherein said generator is also integrated in said monolithic circuit.

11. A measurement circuit according to claim 8, wherein said measurement amplifier is also integrated in said monolithic circuit.

12. A measurement circuit according to claim 1, wherein said generator is a module whose output voltage is referenced to the band gap of a semiconductor.

13. An application of the measurement circuit of claim 1 to an automatic gain control circuit, said circuit comprising an AGC amplifier producing said input signal from a reference signal, wherein the control signal of said AGC amplifier is said measurement signal.

14. An application according to claim 13, wherein said input amplifier is the output stage of said AGC amplifier.

15. An application of the measurement circuit of claim 1 to demodulating an amplitude modulated signal, wherein said correction signal constitutes said compensation signal.

* * * * *